United States Patent
Mazzamuto

(10) Patent No.: US 10,020,192 B2
(45) Date of Patent: Jul. 10, 2018

(54) METHOD FOR FORMING POLYSILICON

(71) Applicant: LASER SYSTEMS & SOLUTIONS OF EUROPE, Gennevilliers (FR)

(72) Inventor: Fulvio Mazzamuto, Paris (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 0 days.

(21) Appl. No.: 15/113,972

(22) PCT Filed: Jan. 22, 2015

(86) PCT No.: PCT/EP2015/051280
§ 371 (c)(1),
(2) Date: Jul. 25, 2016

(87) PCT Pub. No.: WO2015/110548
PCT Pub. Date: Jul. 30, 2015

(65) Prior Publication Data
US 2016/0343569 A1    Nov. 24, 2016

(30) Foreign Application Priority Data

Jan. 24, 2014 (EP) .................................... 14290007

(51) Int. Cl.
*H01L 21/02* (2006.01)

(52) U.S. Cl.
CPC .. *H01L 21/02675* (2013.01); *H01L 21/02422* (2013.01); *H01L 21/02532* (2013.01); *H01L 21/02592* (2013.01); *H01L 21/02691* (2013.01)

(58) Field of Classification Search
USPC ........................... 438/799, 487, 128, 48, 166
See application file for complete search history.

(56) References Cited

U.S. PATENT DOCUMENTS

2002/0058399 A1* 5/2002 Sato .......................... C30B 1/00
                                                                  438/486
2003/0061984 A1* 4/2003 Maekawa ............... C30B 13/00
                                                                     117/4

FOREIGN PATENT DOCUMENTS

DE         102008045533           3/2010

OTHER PUBLICATIONS

Ishihara et al.: "A Novel Double-Pulse Excimer-Laser Crystallization Method of Silicon Thin-Films", Japanese Journal of Applied Physics, Japan Society of Applied Physics, JP, vol. 34, No. 8A, Aug. 1, 1995, pp. 3976-3981, XP000861506.

* cited by examiner

Primary Examiner — Moin Rahman
(74) Attorney, Agent, or Firm — Young & Thompson

(57) ABSTRACT

A method for forming polysilicon on a semiconductor substrate that include providing amorphous silicon on a semiconductor substrate, exposing at least an area of the amorphous silicon to a first laser beam and a second laser beam, characterized in that during exposing the area to the second laser beam no displacement of the laser beam relative to the area occurs. In addition, the use of such method for producing large grain polysilicon. In particular, the use of such method for producing vertical grain polysilicon. Further, the use of such method for producing sensors, MEMS, NEMS, Non Volatile Memory, Volatile memory, NAND Flash, DRAM, Poly Si contacts and interconnects.

20 Claims, 1 Drawing Sheet

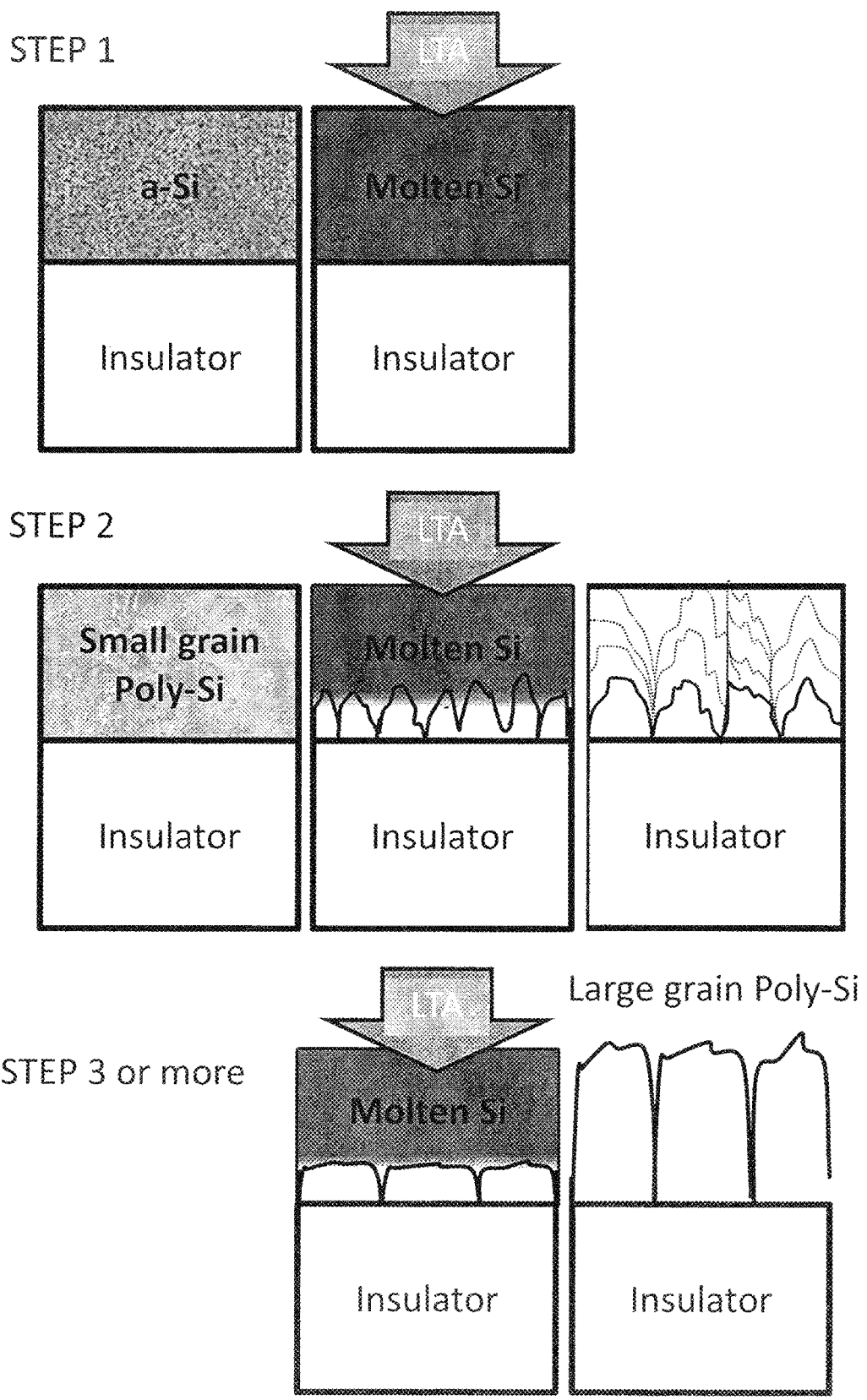

METHOD FOR FORMING POLYSILICON

FIELD OF THE INVENTION

The present invention relates to a method for forming polysilicon on a semiconductor substrate and to the use of such method for producing large grain polysilicon.

BACKGROUND

Large grain polysilicon formation becomes required in an ever-increasing number of semiconductor devices.

Large grain polysilicon can be obtained with standard high thermal budget techniques like furnace annealing, e.g. rapid thermal annealing (RTA) or rapid thermal processing (RTP).

However, a general problem is obviously that in most cases the thermal budget is restricted to lower than 700° C., making it extremely hard to form large grain polysilicon from an amorphous silicon layer with the standard annealing techniques.

In an attempt to overcome the above problem, laser annealing, known to be a low thermal budget process, was proposed as being the most promising solution for low thermal budget polysilicon formation.

However, conventional laser annealing techniques for recrystallizing polysilicon do not allow formation of grain sizes above a few hundred nanometers, and since the carrier mobility is in proportion to amongst others the average grain size, the resulting laser annealed polysilicon shows average or low carrier mobility.

A special technique for forming low thermal budget large grains, as described in U.S. Pat. No. 7,029,996, uses laser annealing with a sequential lateral solidification process. This approach results obviously only in lateral grains, i.e grains extended in a direction parallel to the substrate surface area, and is generally limited to unpatterned polysilicon surfaces.

In addition, person skilled in the art will acknowledge that the equipment required for sequentially performing lateral displacements of the substrate (or the laser) appropriate for inducing lateral solidification is expensive and complex.

Considering the above, it is an object of the present invention to provide a method for forming large grain polysilicon with reduced equipment cost and complexity.

It is also an object of the present invention to provide a method for forming large grain polysilicon with increased throughput compared to state-of-the-art techniques.

It is also an object of the present invention to provide a method for forming large grain polysilicon with sufficient grain size while being exposed to limited thermal budget.

It is another object of the present invention to provide a method for forming large grain polysilicon allowing the formation of large grains in patterned polysilicon layers.

It is further a particular object of the present invention to provide a method for forming large grain polysilicon allowing formation of large vertical grains, i.e grains extended in a direction perpendicular to the substrate surface area.

SHORT DESCRIPTION OF THE DRAWINGS

FIG. 1 illustrates an embodiment of a method in accordance with the present invention.

SUMMARY OF THE INVENTION

The present invention is directed to a method for forming polysilicon on a semiconductor substrate comprising:

providing amorphous silicon on a semiconductor substrate exposing at least an area of the amorphous silicon to a first laser beam and a second laser beam, characterized in that during exposing the area to the second laser beam no displacement of the laser beam relative to the area occurs.

In addition, the present invention is directed to the use of such method for producing large grain polysilicon.

In particular, the present invention is directed to the use of such method for producing vertical grain polysilicon.

Further, the present invention is directed to the use of such method for producing sensors, MEMS, NEMS, Non Volatile Memory, Volatile memory, NAND Flash, DRAM, Poly Si contacts and interconnects.

DETAILED DESCRIPTION

As a first embodiment in accordance with the present invention a method for forming polysilicon on a semiconductor substrate is provided comprising:

providing amorphous silicon on a semiconductor substrate exposing at least an area of the amorphous silicon to a first laser beam and a second laser beam, characterized in that during exposing the area to the second laser beam no displacement of the laser beam relative to the area occurs.

In the context of the present invention, exposing the area to the second laser beam without displacement of the second laser beam relative to the area during exposing the area is understood is exposing the area to the second laser beam without shifting or moving the beam nor the substrate while the beam strikes the area.

A clear benefit of the present invention is that, whereas the sequential lateral solidification technique requires dedicated equipment for making sequential lateral displacements appropriate for inducing lateral solidification, there is no need any more for having such equipment while equally obtaining large grain polysilicon with grain sizes of least 100 nanometres, or at least 1 micrometres, or even at least several micrometres.

Another benefit of a method in accordance with the present invention is that it allows the formation of homogeneous micro-crystal silicon grains.

Further, a method in accordance with the present invention allows the formation of large grains in patterned layers. Since there is no displacement involved in the formation of the large grains, accurate local formation, even at very specific locations on the silicon surface becomes possible.

In addition, it is a significant advantage that a method according to the present invention allows formation of grains extended in a direction perpendicular to the substrate surface area. Whereas the sequential lateral solidification technique does not have the ability to obtain grain sizes above 50 or 100 nanometres in a direction perpendicular to the substrate surface area, the present invention may obtain grain sizes of at least 50 or 100 nanometres, or at least 1 micrometre, or even at least several micrometres in that direction.

In an embodiment in accordance with the present invention, a method is provided wherein the melt depth generated by the second laser beam is smaller than the melt depth generated by the first laser beam. Without being bound by any theory, it is believed that the (relatively small) polysilicon grains formed by exposure to the first laser beam melt partially by being exposed to a second laser beam with a melt depth smaller than the first laser beam. The non-melted parts of the (relatively small) polysilicon grains act as seeds for growth and solidification of large grain polysilicon.

In a particular embodiment, illustrated by FIG. 1, after exposure to the first laser beam (step 1), exposure to the second laser beam (step 2) may be followed by exposure to one or more other laser annealing steps (step 3 or more) during each of which no displacement of the laser beam relatively to the area to be annealed occurs and wherein the melt depth is kept the same compared to the melt depth generated by the second laser beam. Such may result in increasing size and homogeneity of the large grains.

However, by exposing an area to be annealed to a sequence of laser annealing steps in each of which no displacement of the laser beam relatively to the area to be annealed occurs and wherein each subsequent step is performed with lower melt depth than the foregoing, extending the polysilicon grains in vertical direction may be even more enhanced.

In an embodiment in accordance with the present invention, making the melt depth generated by the second laser beam smaller than the melt depth generated by the first laser beam may be achieved by using a second laser beam with a lower energy density than the first laser beam. In order to achieve different energy densities, any known technique for adjusting the energy density on the surface area. For example, the laser beam energy may be adapted, the wavelength may be adapted, or a modification in the optical system may be used such as a filter or a mask.

Alternative to achieving different melt depths by using different energy densities, also different pulse durations may be used, or a combination of different energy densities and different pulse durations.

In another embodiment in accordance with the present invention and as also illustrated in FIG. 1, the amorphous silicon may be provided on top of an insulator layer thereby defining an interface between the silicon material and the insulator material, and the melt depth generated by the first laser beam may be sufficient for melting the amorphous silicon up to the silicon-insulator interface (step 1). Obtaining a melt depth up to the silicon-insulator interface may be achieved by making the first laser beam generating an energy density sufficient for melting the amorphous silicon up to the silicon-insulator interface. Then, the (relatively small) polysilicon grains formed by exposure to the first laser beam melt partially by being exposed to a second laser beam (step 2) with a melt depth smaller than the first laser beam. The non-melted parts of the (relatively small) polysilicon grains act as seeds for growth and solidification of large grain polysilicon. One or more other laser annealing steps (step 3 or more) may follow.

The melt depth generated by the second laser beam (step 2) is smaller than the melt depth generated by the first laser beam In an embodiment in accordance with the present invention, the laser energy densities used may be between 0.01 J/cm2 and 10 J/cm2. The difference between the energy density of the first laser beam and the energy density of the second laser beam may be less than 0.5 J/cm2, or less than 0.2 J/cm2, or less than 0.1 J/cm2.

The present invention may be used in any situation wherein large grain polysilicon should be formed without a polysilicon seed layer being present, for example in case large grain polysilicon should be formed from an amorphous silicon layer deposited on an insulator.

The first laser beam and the second laser beam may be generated by different laser sources with different laser parameters, or preferably by a single laser source suitable for operating with different laser annealing parameters. Using a single laser source requires less complex equipment and limits the cost compared to a multiple laser source approach.

The laser sources used may be any laser source whose wavelength, energy and pulse duration is adapted to the process, such as solid state lasers, diode lasers, fiber lasers, UV lasers or excimer lasers. Preferably, the laser source may be an excimer laser, more preferably a xenon chloride excimer laser.

The wavelength of the laser source(s) may be in the range of 100 nm to 900 nm, 190 nm to 600 nm, 190 nm to 550 nm, or preferably 190 nm to 480 nm due to the high energy absorption of silicon at those wavelengths. Exposure to the first laser beam and to the second laser beam may be done at different wavelengths, each adapted to the required melt depth (or energy density).

In an embodiment in accordance with the present invention, a pulse duration may be used in the range between about 1 ns and 10 ms, for example between about 1 ns and 1 ms, preferably between 1 ns and 250 ns. Exposure to the first laser beam and to the second laser beam may be done at different pulse durations, each adapted to the required melt depth.

In an embodiment in accordance with the present invention, exposure to the first laser beam and exposure to the second laser beam may each comprise only one single laser pulse.

The laser beam energy of the laser source(s) may be in the range of 1 Joules to 25 Joules allowing obtaining the required melt depth over an area up to a full die, or even a full wafer. In order to achieve these energies, the laser discharge volume is optimized to typically 10 cm (inter electrodes spacing)×7 to 10 cm (discharge width)×100 to 200 cm (discharge length). It is clear that the ability to anneal a large area up to a full wafer with one shot, in combination with the fact that there is no lateral displacement required for obtaining large grains, may be a very significant advantage in terms of throughput compared to sequential lateral solidification.

In an embodiment in accordance with the present invention, while being exposed to laser annealing the semiconductor substrate may not be heated and at ambient temperature, preferably room temperature. In contrast to state of the art methods wherein the semiconductor substrate is placed on a heated chuck in order to reduce the solidification speed and enhance grain growth, a method in accordance with the present invention does not require heating of the semiconductor substrate. So, the thermal budget where the annealed areas are exposed to, is only generated by the laser beam energy itself and therefore it can be accurately controlled and restricted as much as possible.

Instead of sequentially annealing each area to be annealed first by the first laser beam and subsequently by the second laser beam, it may be advantageous with respect to throughput to use a method wherein a plurality of areas of the substrate are first exposed to the first laser beam and wherein each of the plurality of areas is then exposed to the second laser beam (or to one or more other laser annealing steps).

In a particular embodiment, an amorphous silicon layer is exposed to the first excimer laser beam on a large surface area. The energy density for this first laser beam ($ED_1$) is selected to fully melt and re-crystallize the silicon layer up to a buried insulator interface. After this first annealing step, as previously mentioned, polysilicon with small average grains is formed. Then, the same area is annealed with a second excimer laser beam. A lower energy density ($ED_1$-

ΔED) for this second laser beam is used to sensibly reduce the melting depth compared to the first laser beam. Microcrystal silicon grains at the silicon/insulator interface, formed by the first excimer laser beam, are not completely molten and used as seed for vertical recrystallization and solidification. The result is that silicon grains can grow vertically from a large and regular seed interface and that micrometric silicon grains can be formed simultaneously on a large surface area.

As a method in accordance with the present invention is extremely useful for generating large grain polysilicon in general and vertical large grain polysilicon in particular, it may contribute to cost effective and device performance enhancing production of sensors, MEMS, NEMS, Non Volatile Memory, Volatile memory, NAND Flash, DRAM, Poly Si contacts and interconnects.

The invention claimed is:

1. A method for forming polysilicon on a surface of an insulator layer or of a semiconductor substrate comprising:
   providing an amorphous silicon layer on said insulator or semiconductor substrate, defining an interface between said amorphous silicon layer and said insulator layer or semiconductor substrate;
   a first step of exposing at least an area of the amorphous silicon layer to a first laser beam and a second step of exposing said area to a second laser beam,
   wherein during exposing the area to the second laser beam no displacement of the laser beam relative to the area occurs, and wherein:
   during the first step, the energy density and/or pulse duration generated by the first laser beam is selected to fully melt the amorphous silicon layer up to said interface, and so as to form by recrystallization a polysilicon layer with relatively small polysilicon grains,
   and during the second step, the energy density and/or pulse duration generated by the second laser beam is lower than the energy density and/or, respectively, pulse duration generated by the first laser beam, the energy density and/or pulse duration generated by the second laser beam being selected to partially melt the polysilicon grains formed by the first laser beam, and so as to enhance growth and solidification of relatively larger grain polysilicon with grain sizes of more than 1 micrometer in a direction perpendicular to the surface of the insulator layer or semiconductor substrate.

2. The method according to claim 1, wherein the melt depth generated by the second laser beam is smaller than the melt depth generated by the first laser beam.

3. The method according to claim 1, wherein the energy density generated by the second laser beam is lower than the energy density generated by the first laser beam.

4. The method according to claim 1 wherein the amorphous silicon is provided on top of an insulator layer thereby defining an interface, and wherein the energy density generated by the first laser beam is sufficient for melting the amorphous silicon up to the amorphous silicon-insulator interface.

5. The method according to claim 1, wherein the first and second laser beam are generated by the same laser source.

6. The method according to claim 1, wherein during laser annealing the semiconductor substrate is kept at room temperature.

7. The method according to claim 1 wherein a plurality of areas of the amorphous silicon layer are first exposed to the first laser beam and wherein each of the plurality of areas is subsequently exposed to the second laser beam.

8. A method for producing large-grain polysilicon with grain sizes of least 1 micrometer in a direction perpendicular to a surface of an insulator layer or semiconductor substrate, comprising forming polysilicon on the surface of the insulator layer or semiconductor substrate according to the method of claim 1.

9. A method for producing vertical grain polysilicon extended in a direction perpendicular to a surface of an insulator layer or semiconductor substrate, comprising forming polysilicon on the surface of the insulator layer or semiconductor substrate according to the method of claim 1.

10. A method for producing sensors, MEMS, NEMS, Non Volatile Memory, Volatile memory, NAND Flash, DRAM, Poly Si contacts and interconnects, comprising forming polysilicon on a surface of an insulator layer or semiconductor substrate according to the method of claim 1.

11. The method according to claim 3, wherein the amorphous silicon is provided on top of an insulator layer thereby defining an interface, and wherein the energy density generated by the first laser beam is sufficient for melting the amorphous silicon up to the amorphous silicon-insulator interface.

12. The method according to claim 3, wherein the first and second laser beam are generated by the same laser source.

13. The method according to claim 3, wherein during laser annealing the semiconductor substrate is kept at room temperature.

14. The method according to claim 3, wherein a plurality of areas of the amorphous silicon layer are first exposed to the first laser beam and wherein each of the plurality of areas is subsequently exposed to the second laser beam.

15. The method according to claim 4, wherein the first and second laser beam are generated by the same laser source.

16. The method according to claim 4, wherein during laser annealing the semiconductor substrate is kept at room temperature.

17. The method according to claim 4, wherein a plurality of areas of the amorphous silicon layer are first exposed to the first laser beam and wherein each of the plurality of areas is subsequently exposed to the second laser beam.

18. The method according to claim 5, wherein during laser annealing the semiconductor substrate is kept at room temperature.

19. The A method according to claim 5, wherein a plurality of areas of the amorphous silicon layer are first exposed to the first laser beam and wherein each of the plurality of areas is subsequently exposed to the second laser beam.

20. The method according to claim 6, wherein a plurality of areas of the amorphous silicon layer are first exposed to the first laser beam and wherein each of the plurality of areas is subsequently exposed to the second laser beam.

* * * * *